(12) United States Patent
Adabi et al.

(10) Patent No.: US 9,685,981 B2
(45) Date of Patent: Jun. 20, 2017

(54) RADIO FREQUENCY SYSTEM HYBRID POWER AMPLIFIER SYSTEMS AND METHODS

(71) Applicant: APPLE INC., Cupertino, CA (US)

(72) Inventors: Ehsan Adabi, Mountain View, CA (US); Albert C. Jerng, Woodside, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 14/641,031

(22) Filed: Mar. 6, 2015

(65) Prior Publication Data

US 2016/0261293 A1    Sep. 8, 2016

(51) Int. Cl.
| | |
|---|---|
| H04B 1/04 | (2006.01) |
| H03F 1/02 | (2006.01) |
| H03F 3/195 | (2006.01) |
| H03F 3/21 | (2006.01) |
| H03F 3/217 | (2006.01) |

(Continued)

(52) U.S. Cl.
CPC ......... *H04B 1/0458* (2013.01); *H03F 1/0222* (2013.01); *H03F 1/0277* (2013.01); *H03F 3/195* (2013.01); *H03F 3/211* (2013.01); *H03F 3/2178* (2013.01); *H03F 3/245* (2013.01); *H03F 3/72* (2013.01); *H04B 1/0475* (2013.01); *H03F 2200/507* (2013.01); *H04B 2001/0408* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,554,512 A | * | 11/1985 | Aiello | .................. H03F 3/2171 330/10 |
| 6,256,482 B1 | | 7/2001 | Raab | |

(Continued)

FOREIGN PATENT DOCUMENTS

| | | |
|---|---|---|
| EP | 1505725 A1 | 2/2005 |
| WO | 2010041181 A1 | 4/2010 |

OTHER PUBLICATIONS

International Search Report and Written Opinion for PCT Application No. PCT/US2016/019349 dated May 20, 2016; 12 pgs.

*Primary Examiner* — Junpeng Chen
(74) *Attorney, Agent, or Firm* — Fletcher Yoder PC

(57) ABSTRACT

Systems and method for improving operation of a radio frequency system are provided. One embodiment provides a radio frequency system that includes a first amplifier unit with a first logic gate, which receives an input analog electrical signal and a first bit of an amplifier control signal that enables or disables the first amplifier unit, and a first switching power amplifier that generates a first output analog electrical signal when enabled. The radio frequency system further includes a second amplifier unit with a second logic gate, which receives the input analog electrical signal and a second bit of the amplifier control signal that enables or disables the second amplifier unit, and a second switching power amplifier that generates a second output analog electrical signal when enabled. The first amplifier unit and the second amplifier unit are electrically coupled to enable the first output analog electrical signal and the second output analog electrical signal to be combined.

26 Claims, 9 Drawing Sheets

(51) Int. Cl.
*H03F 3/24* (2006.01)
*H03F 3/72* (2006.01)

(56) References Cited

U.S. PATENT DOCUMENTS

| | | | | |
|---|---|---|---|---|
| 2005/0064830 A1* | 3/2005 | Grigore | ............... | H03C 5/00 455/127.4 |
| 2006/0292999 A1* | 12/2006 | Sorrells | ............... | H03C 5/00 455/110 |
| 2008/0111622 A1 | 5/2008 | Sperlich et al. | | |
| 2009/0160555 A1* | 6/2009 | Sun | ............... | H03F 1/0227 330/273 |
| 2010/0266066 A1* | 10/2010 | Takahashi | ............ | H03G 3/004 375/295 |
| 2013/0147549 A1 | 6/2013 | Maniwa et al. | | |
| 2014/0097893 A1* | 4/2014 | Ajima | ............... | H03F 3/245 330/136 |
| 2014/0218104 A1* | 8/2014 | Kunihiro | ............ | H03F 1/0277 330/10 |
| 2014/0341097 A1 | 11/2014 | Gomez et al. | | |
| 2015/0236877 A1* | 8/2015 | Peng | ............... | H04L 25/08 375/297 |

* cited by examiner

RADIO FREQUENCY SYSTEM HYBRID POWER AMPLIFIER SYSTEMS AND METHODS

BACKGROUND

The present disclosure relates generally to radio frequency systems and, more particularly, to a power amplifier component used in a radio frequency system.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Many electronic devices may include a radio frequency system to facilitate wireless communication of data with another electronic device and/or a network. The radio frequency system may include a transceiver that outputs an analog representation of data as an analog electrical signal, which may then be wirelessly transmitted via an antenna. Since the electronic device may be separated by some distance, the radio frequency system may include an amplifier component to control the output power (e.g., strength of transmitted analog electrical signals) of the radio frequency system.

Generally, amplifier components may utilize various techniques to amplify an input analog electrical signal to a desired output power. However, the techniques typically have tradeoffs between at least power consumption and introduced noise and spurs. For example, some techniques may reduce introduced noise and spurs but increase power consumption, thereby decreasing efficiency (e.g., output power/DC power consumption) of the radio frequency system. On the other hand, some techniques may reduce power consumption but increase introduced noise, which may increase transmitted spurious emissions.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure generally relates to an improved power amplifier component used in a radio frequency system. Generally, a power amplifier component receives an input analog electrical signal and outputs an amplified analog electrical signal, which may then be wirelessly transmitted to another electronic device and/or a network.

The present disclosure describes an amplifier component that may generate the amplified analog electrical signal with reduced power consumption, thereby improving efficiency, without introducing significant noise, thereby reducing spurious emissions transmitted. In some embodiments, the amplifier component may generate the amplified analog electrical signal based at least in part on an envelope voltage signal, an input analog electrical signal, and amplifier control signal. More specifically, the amplifier component may include an envelope voltage amplifier that receives the envelope voltage signal and outputs electrical power at the envelope voltage to a variable voltage supply rail.

Additionally, the amplifier component may include a plurality of amplifier units that each receives the input analog electrical signal and one bit of the amplifier control signal. More specifically, each amplifier unit may include a logic gate (e.g., an AND gate or a NAND gate), which receives the input analog electrical signal and the bit of the amplifier control signal, a driver (e.g., buffer), which receives the output from the logic gate, and a switching power amplifier, which receives the output from the driver and electrical power output from the variable voltage supply rail.

In operation, the magnitude (e.g., amplitude) of the amplified analog electrical signal may be controlled via the envelope voltage signal and the amplifier control signal. More specifically, the amplifier control signal may enable or disable each of the plurality of amplifier units based on the desired output power. Each enabled amplifier unit may then amplify the input analog electrical signal based at least in part on the envelope voltage signal. More specifically, in an enabled amplifier unit, the switching power amplifier may generate an output analog electrical signal by connecting an output to the variable voltage supply rail or ground based at least in part on the input analog electrical signal.

In other words, the output power may be controlled at least in part by adjusting the number of enabled amplifier units as well as the envelope voltage supplied to the enabled amplifier units via the variable voltage supply rail. In this manner, power consumption of the amplifier component may be reduced, particularly at low output powers, by adjusting number of amplifier units enabled. Moreover, since the amplifier units may be enabled/disabled prior to generating the amplified analog electrical signal, any resulting noise or transient signal would not significantly affect the amplified analog electrical signal.

BRIEF DESCRIPTION OF THE DRAWINGS

Various aspects of this disclosure may be better understood upon reading the following detailed description and upon reference to the drawings in which.

DETAILED DESCRIPTION

Figure 1:
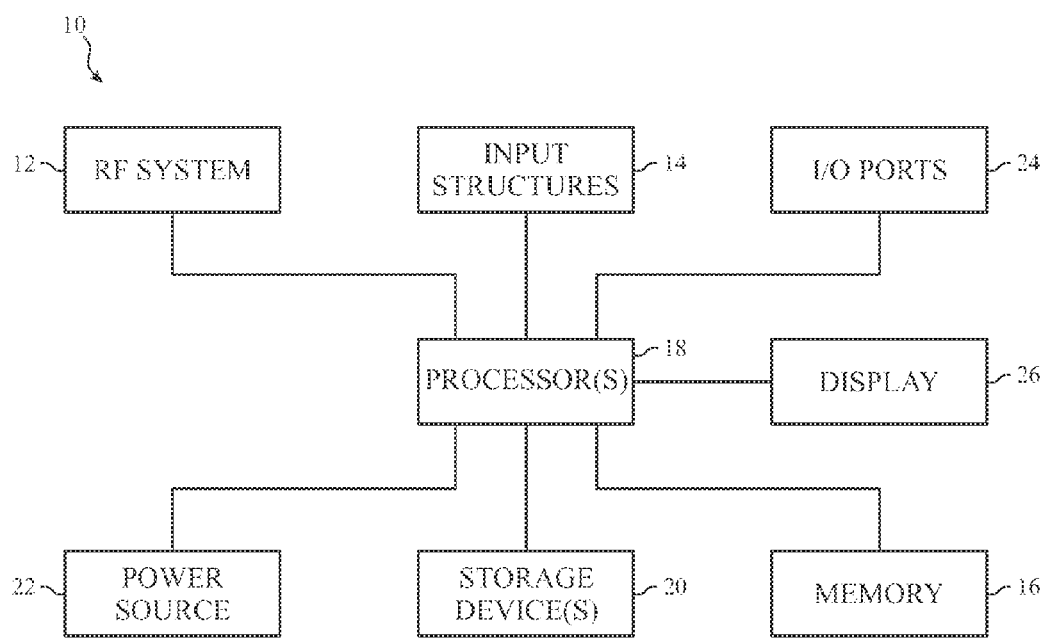
FIG. 1 is a block diagram of a electronic device with a radio frequency system, in accordance with an embodiment.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

As mentioned above, an electronic device may include a radio frequency system to facilitate wirelessly communicating data with another electronic device and/or a network. More specifically, the radio frequency system may modulate radio waves to enable the electronic device to communicate via a personal area network (e.g., Bluetooth network), a local area network (e.g., an 802.11x Wi-Fi network), and/or a wide area network (e.g., a 4G or LTE cellular network). In other words, the radio frequency systems may utilize various wireless communication protocols to facilitate communication of data.

Nevertheless, radio frequency systems may generally be operationally similar regardless of the wireless communication protocol used. For example, to transmit data, processing circuitry may generate a digital representation of the data as a digital electrical signal and a transceiver (e.g., a transmitter and/or a receiver) may then convert the digital electrical signal into one or more analog electrical signals. Based on various factors (e.g., wireless communication protocol, power consumption, distance, etc.), the analog electrical signals may be wirelessly transmitted at different output powers. To facilitate controlling the output power, the radio frequency system may include an amplifier component, which receives the analog electrical signals and outputs amplified analog electrical signals at a desired output power for transmission via an antenna.

Various techniques may be utilized to generate the amplified analog electrical signals at the desired output power. Some techniques include one or more switching power amplifiers to generate the amplified analog electrical signals by connecting an output to either a supply voltage rail or ground based on an input analog electrical signal. For example, when the input analog electrical signal is low (e.g., zero volts) the switching power amplifier may connect the output to ground. On the other hand, when the input signal is high (e.g., a positive voltage) the switching amplifier may connect the output the supply voltage supply rail.

As can be appreciated, the desired output power may change over the course of operation of the radio frequency system. To facilitate adjusting output power, the amplifier component may control the magnitude (e.g., amplitude) of the amplified analog electrical signal. For example, in an analog approach, a driver may amplify an input analog electrical signal to a driving voltage (e.g., voltage sufficient to drive a switching power amplifier) and a switching power amplifier may selectively couple an output to either a variable voltage supply voltage rail or ground. As such, the amplitude of the amplified analog electrical signal may be controlled by adjusting voltage on the variable voltage supply rail. On the other hand, in a digital approach, a plurality of switching power amplifiers may be continuously (e.g., every few nanoseconds) enabled or disabled such that the enabled switching power amplifiers selectively couple an output to either a fixed voltage supply rail or ground. As such, the amplitude of the amplified analog electrical signal may be controlled by adjusting number of switching power amplifiers used to generate the amplified analog electrical signal at each instant.

However, some of the various techniques may cause tradeoffs between at least efficiency (e.g., output power/DC power consumption) of the radio frequency system and amount of spurious emissions transmitted from the radio frequency system. For example, in the digital approach, continuously enabling and disabling the switching power amplifiers may introduce noise in the amplified analog electrical signal, which may increase spurious emissions transmitted from the radio frequency system. Additionally, in the digital approach, a large number of switching power amplifiers may be used to achieve desired accuracy. Furthermore, in the analog approach, all the unit cells in the switching PA are active and the driver may amplify to the driving voltage regardless of the desired output power, which may decrease efficiency of the radio frequency system, particularly at low output powers.

Accordingly, as will be described in more detail below, the present disclosure provides an improved amplifier component for a radio frequency system, which may enable reduced power consumption without significantly increasing noise and spurious emission. In some embodiments, the amplifier component may include a plurality of amplifier units, which each includes a logic gate (e.g., an AND gate or a NAND gate), a driver (e.g., buffer) coupled to the output of the logic gate, and a switching power amplifier coupled to the output of the driver. Additionally, the logic gate may receive an input analog electrical signal and a bit of an amplifier control signal, and the switching power amplifier may be electrically coupled to ground and a variable voltage supply rail, which has a voltage based on an envelope voltage signal.

Thus, in operation, the amplifier component may generate an amplified analog electrical signal by amplifying the input analog electrical signal based at least in part on the envelope voltage signal and the amplifier control signal. More specifically, the number of amplifier units enabled may be adjusted by the amplifier control signal based at least in part on a desired output power of the radio frequency system. For example, when maximum output power is desired, the amplifier control signal may enable each of the amplifier units. However, as the desired output power decreases, the amplifier control signal may disable one or more of the amplifier units. In other words, power consumption may be reduced by disabling amplifier units and their associated drivers, particularly at low output powers. Moreover, since the amplifier units may be enabled/disabled prior to generating the amplified analog electrical signal, any resulting noise and transients would not significantly affect the amplified analog electrical signal.

Additionally, in each enabled amplifier unit, the driver and the switching power amplifier may amplify the input analog electrical signal by connecting an output to the variable voltage (e.g., $V_{env}$) supply rail or ground. For example, when the input analog electrical signal is high (e.g., a positive voltage), the switching power amplifier may connect the output to the variable voltage supply rail. On the other hand, when the input analog electrical signal is low (e.g., zero volts), the switching power amplifier may connect the output ground. As such, by adjusting the voltage on the variable voltage supply rail, each configuration of enabled amplifier units may be capable of generating the amplified analog electrical signal over a range of output power, thereby further reducing frequency of enabling and/or disabling amplifier units.

In this manner, operation of the amplifier component may be controlled based on a desired output power, thereby improving efficiency of the radio frequency system while not introducing significant noise and spurious emission. To help illustrate, an electronic device 10 that may utilize a radio frequency system 12 is described in FIG. 1. As will be described in more detail below, the electronic device 10 may be any suitable electronic device, such as a handheld computing device, a tablet computing device, a notebook computer, and the like.

Accordingly, as depicted, the electronic device 10 includes the radio frequency system 12, input structures 14, memory 16, one or more processor(s) 18, one or more storage devices 20, a power source 22, input/output ports 24, and an electronic display 26. The various components described in FIG. 1 may include hardware elements (including circuitry), software elements (including computer code stored on a non-transitory computer-readable medium), or a combination of both hardware and software elements. It should be noted that FIG. 1 is merely one example of a particular implementation and is intended to illustrate the types of components that may be present in the electronic device 10. Additionally, it should be noted that the various depicted components may be combined into fewer components or separated into additional components. For example, the memory 16 and a storage device 20 may be included in a single component.

As depicted, the processor 18 is operably coupled with memory 16 and the storage device 20. More specifically, the processor 18 may execute instruction stored in memory 16 and/or the storage device 20 to perform operations in the electronic device 10, such as instructing the radio frequency system 12 to communicate with another device. As such, the processor 18 may include one or more general purpose microprocessors, one or more application specific integrated circuits (ASICs), one or more field programmable logic arrays (FPGAs), or any combination thereof. Additionally, memory 16 and/or the storage device 20 may be a tangible, non-transitory, computer-readable medium that stores instructions executable by and data to be processed by the processor 18. For example, the memory 16 may include random access memory (RAM) and the storage device 20 may include read only memory (ROM), rewritable flash memory, hard drives, optical discs, and the like.

Additionally, as depicted, the processor 18 is operably coupled to the power source 22, which provides power to the various components in the electronic device 10. For example, the power source 22 may supply direct current (DC) electrical power to the radio frequency system 12. As such, the power source 22 may include any suitable source of energy, such as a rechargeable lithium polymer (Li-poly) battery and/or an alternating current (AC) power converter. Furthermore, as depicted, the processor 18 is operably coupled with I/O ports 24, which may enable the electronic device 10 to interface with various other electronic devices, and input structures 14, which may enable a user to interact with the electronic device 10. Accordingly, the inputs structures 14 may include buttons, keyboards, mice, trackpads, and the like. Additionally, in some embodiments, the electronic display 26 may include touch sensitive components.

In addition to enabling user inputs, the electronic display 26 may display image frames, such as a graphical user interface (GUI) for an operating system, an application interface, a still image, or video content. As depicted, the display is operably coupled to the processor 18. Accordingly, the image frames displayed by the electronic display 26 may be based on display image data received from the processor 18.

As depicted, the processor 18 is also operably coupled with the radio frequency system 12, which may facilitate communicatively coupling the electronic device 10 to one or more other electronic devices and/or networks. For example, the radio frequency system 12 may enable the electronic device 10 to communicatively couple to a personal area network (PAN), such as a Bluetooth network, a local area network (LAN), such as an 802.11x Wi-Fi network, and/or a wide area network (WAN), such as a 4G or LTE cellular network. As can be appreciated, the radio frequency system 12 may enable communication using various communication protocols and/or varying output powers (e.g., strength of transmitted analog electrical signals).

Operational principles of the radio frequency system 12 may be similar for each of the communication protocols (e.g., Bluetooth, LTE, 802.11x Wi-Fi, etc). More specifically, as will be described in more detail below, the radio frequency system 12 may convert a digital electrical signal containing data desired to be transmitted into an analog electrical signal using a transceiver. The radio frequency system 12 may then amplify the analog electrical signal to a desired output using an amplifier component and output the amplified analog signal using one or more antennae. In other words, the techniques described herein may be applicable to any suitable radio frequency system 12 that operates in any suitable manner regardless of communication protocol used.

Figure 2:
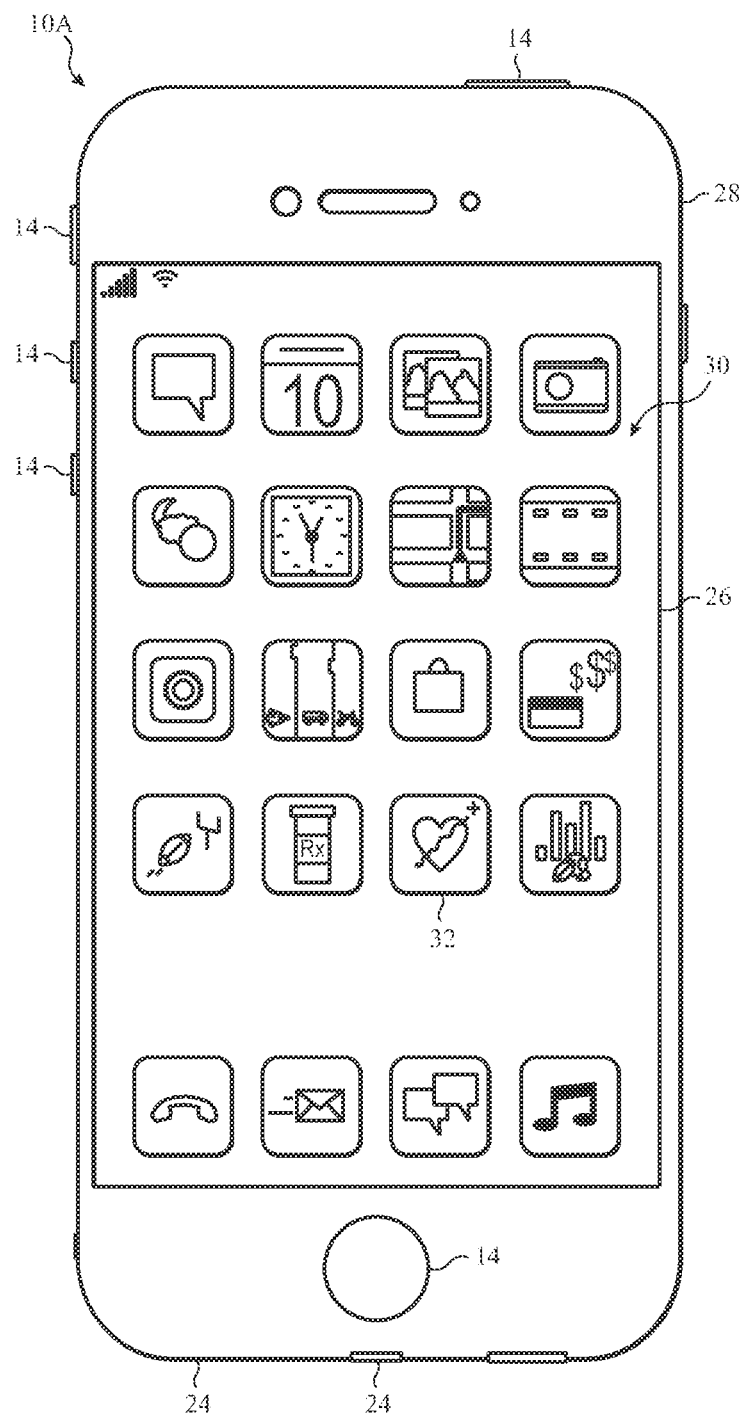
FIG. 2 is an example of the electronic device of FIG. 1, in accordance with an embodiment.

As described above, the electronic device 10 may be any suitable electronic device. To help illustrate, one example of a handheld device 10A is described in FIG. 2, which may be a portable phone, a media player, a personal data organizer, a handheld game platform, or any combination of such devices. For example, the handheld device 10A may be a smart phone, such as any iPhone® model available from Apple Inc. As depicted, the handheld device 10A includes an enclosure 28, which may protect interior components from physical damage and to shield them from electromagnetic interference. The enclosure 28 may surround the electronic display 26, which, in the depicted embodiment, displays a graphical user interface (GUI) 30 having an array of icons 32. By way of example, when an icon 32 is selected either by an input structure 14 or a touch sensing component of the electronic display 26, an application program may launch.

Additionally, as depicted, input structures 14 may open through the enclosure (e.g., housing) 28. As described above, the input structures 14 may enable a user to interact with the handheld device 10A. For example, the input structures 14 may activate or deactivate the handheld device 10A, navigate a user interface to a home screen, navigate a user interface to a user-configurable application screen, activate a voice-recognition feature, provide volume control, and toggle between vibrate and ring modes. Furthermore, as depicted, the I/O ports 24 open through the enclosure 28. In some embodiments, the I/O ports 24 may include, for example, an audio jack to connect to external devices. Additionally, the radio frequency system 12 may also be enclosed within the enclosure 28 and internal to the handheld device 10A.

Figure 3:
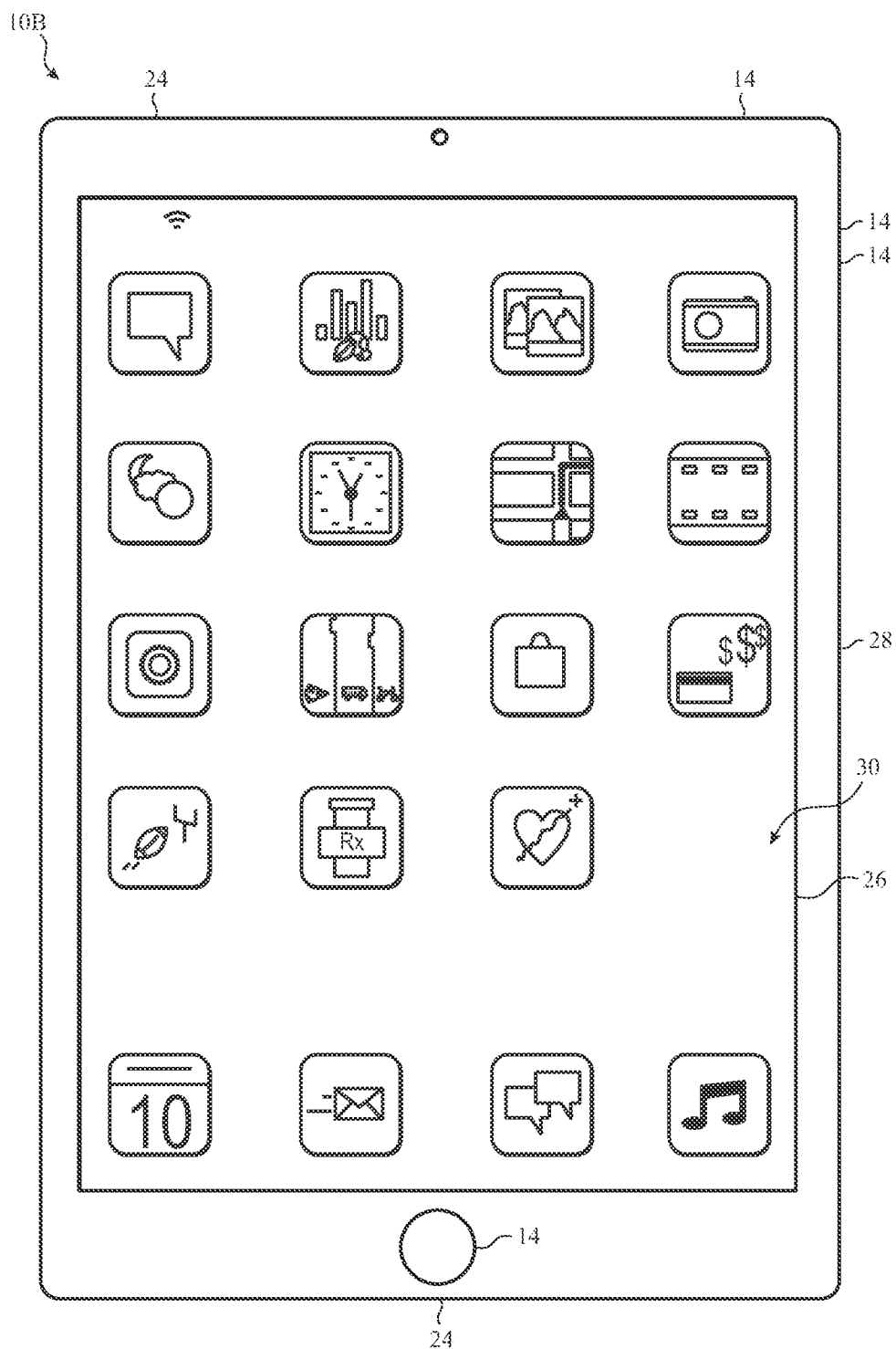
FIG. 3 is an example of the electronic device of FIG. 1, in accordance with an embodiment.
Figure 4:
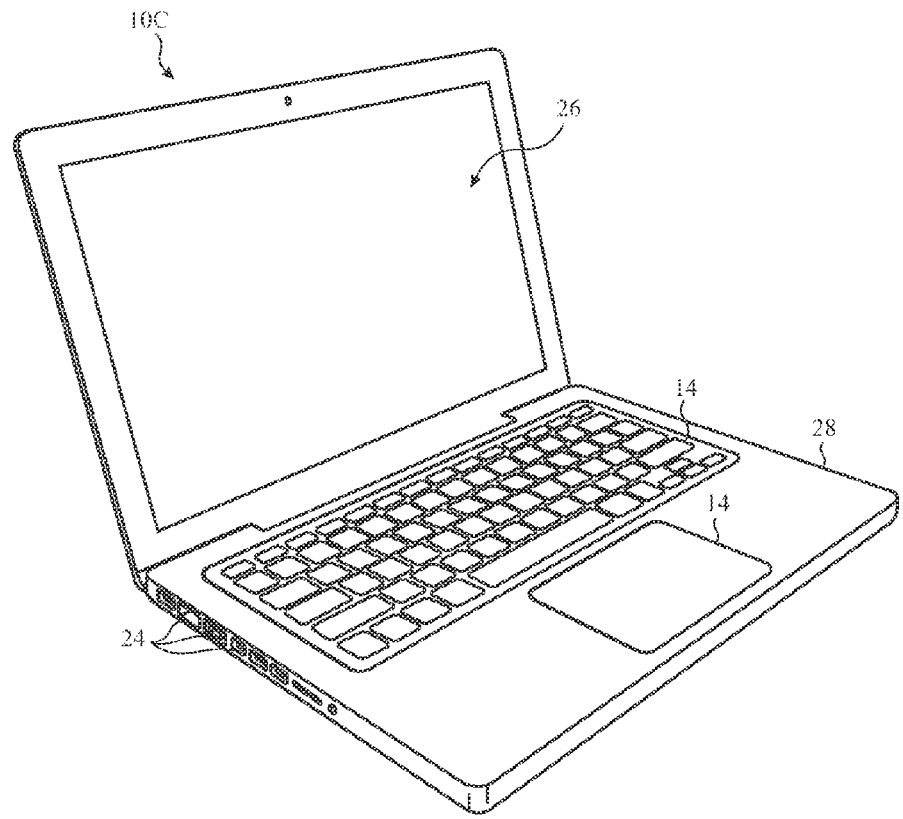
FIG. 4 is an example of the electronic device of FIG. 1, in accordance with an embodiment.

To further illustrate a suitable electronic device 10, a tablet device 10B is described in FIG. 3, such as any iPad® model available from Apple Inc. Additionally, in other embodiments, the electronic device 10 may take the form of a computer 10C as described in FIG. 4, such as any Macbook® or iMac® model available from Apple Inc. As depicted, the tablet device 10B and the computer 10C also include an electronic display 26, input structures 14, I/O ports 24, and an enclosure (e.g., housing) 28. Similar to the handheld device 10A, the radio frequency system 12 may also be enclosed within the enclosure 28 and internal to the tablet device 10B and/or the computer 10C.

Figure 5:
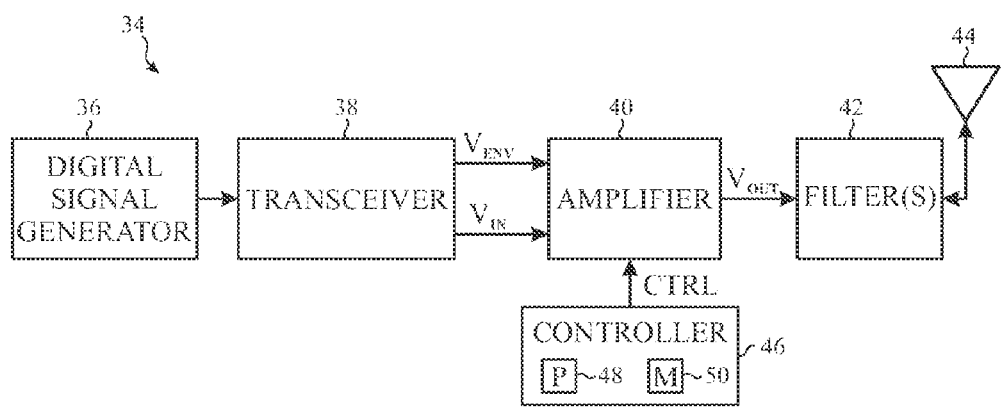
FIG. 5 is block diagram of the radio frequency system of FIG. 1, in accordance with an embodiment.

As described above, the radio frequency system 12 may facilitate communication with other electronic devices and/or a network by wirelessly communicating data. To help illustrate, a portion 34 of radio frequency system 12 is described in FIG. 5. As depicted, the portion 34 includes a digital signal generator 36, a transceiver 38, an amplifier component 40, one or more filters 42, an antenna 44, and a controller 46. More specifically, the controller 46 may include one or more processors 48 and memory 50 to facilitate controlling operation of the radio frequency system 12. For example, the controller 46 may instruct the amplifier component 40 to enable or disable amplifier units via an amplifier control signal (e.g., Ctrl) based on a desired output power of the radio frequency system 12. Accordingly, in some embodiments, the controller processor 48 may be included in the processor 18 and/or separate processing circuitry and the memory 50 may be included in memory 16 and/or a separate tangible non-transitory computer-readable medium.

Additionally, the digital signal generator 36 may generate a digital representation of data desired to be transmitted from the electronic device 10 by outputting a digital electrical signal. Accordingly, in some embodiments, the digital signal generator 36 may include the processor 18 and/or a separate processing circuitry, such as a baseband processor or a modem in the radio frequency system 12.

The transceiver 38 may then receive the digital electrical signal and generate an analog representation of the data. In some embodiments, the transceiver 38 may generate an analog representation by outputting an envelope voltage (e.g., $V_{env}$) to indicate a desired output power of the radio frequency system 12 and an analog electrical signals (e.g., $V_{in}$) to indicate phase (e.g., whether high or low and the frequency by which it switches between 1 and 0 is a function of the phase information) of the digital electrical signal. For example, when the desired output is a maximum output power (e.g., $P_{max}$), the transceiver 38 may output a maximum envelope voltage (e.g., $V_{max}$). Additionally, when the digital electrical signal is high (e.g., "1"), the transceiver 38 may output an analog electrical signal with a positive voltage and, when the digital electrical signal is low (e.g., "0"), the transceiver 38 may output an analog electrical signal at zero volts and the frequency by which it switches between 0 and 1 is a function of the phase information.

Since the output power of the analog electrical signal may be small, the amplifier component 40 may receive and amplify the analog electrical signal by outputting an amplified analog electrical signal (e.g., $V_{out}$). More specifically the amplifier component 40 may vary amplitude of the amplified analog electrical signal to enable the output power of the radio frequency system 12 to be adjusted. As will be described in more detail below, the amplifier component 40 may adjust amplitude of the amplified analog electrical signal based at least in part on the envelope voltage signal received from the transceiver 38 and the amplifier control signal received from the controller 46.

As can be appreciated, noise may be introduced by the transceiver 38 and/or the amplifier component 40, such as spurious or out of band noise. As such, one or more filters 42 may remove introduced noise from the amplified analog electrical signal and output a filtered analog electrical signal. The filtered analog electrical signal may then be wirelessly transmitted to another electronic devices and/or a network via the antenna 44 as modulated radio waves.

Figure 6:
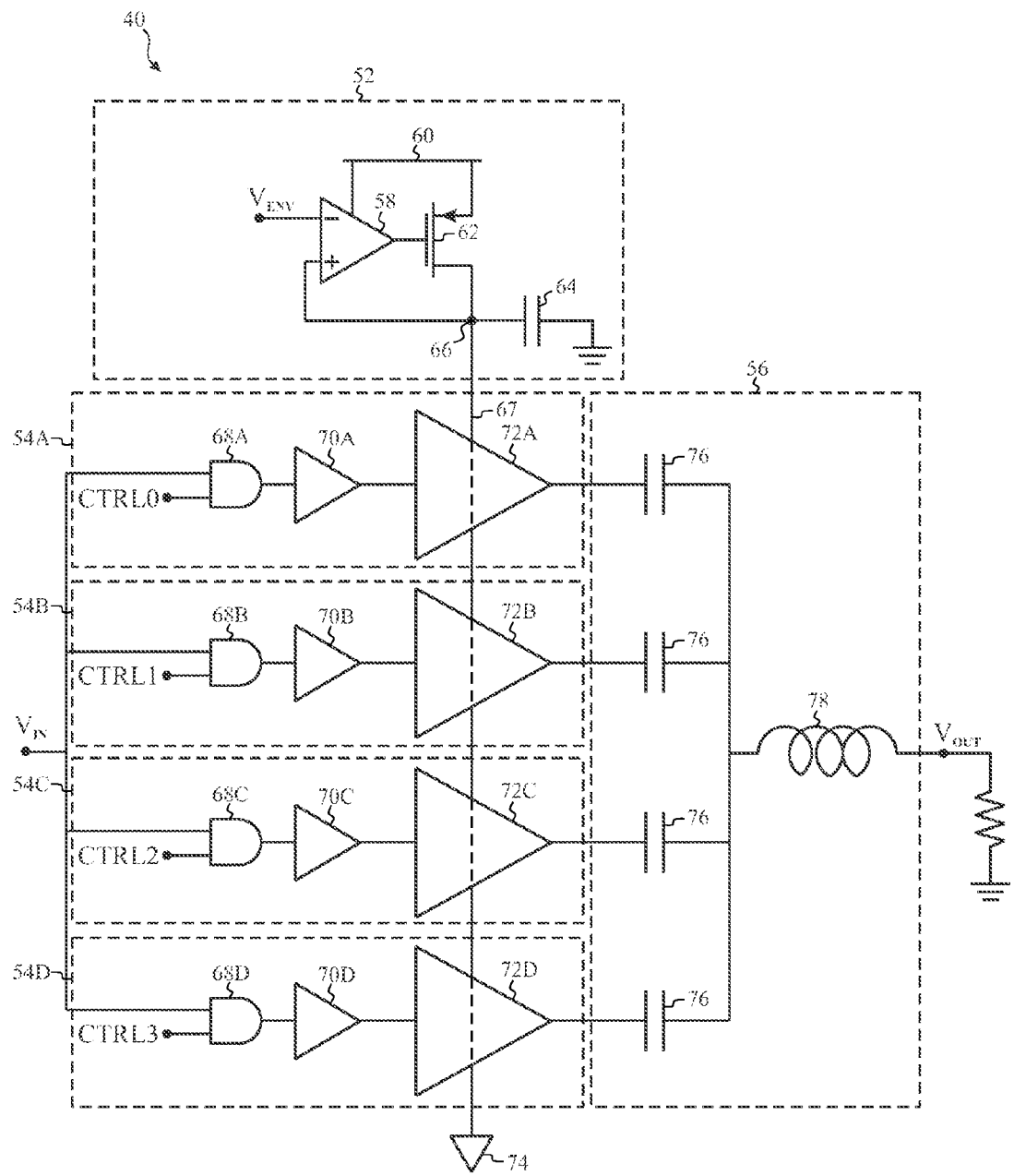
FIG. 6 is a schematic diagram of an amplifier component used in the radio frequency system of FIG. 5, in accordance with an embodiment.

As described above, the amplifier component 40 may facilitate controlling magnitude (e.g., amplitude) of the amplified analog electrical signal and, thus, output power of the radio frequency system 12. To help illustrate, a more detailed view of the amplifier component 40 is described in FIG. 6. In the depicted embodiment, the amplifier component 40 includes an envelope voltage amplifier 52, a plurality of amplifier units 54, and matching components 56. More specifically, the depicted embodiment includes a first amplifier unit 54A, a second amplifier unit 54B, a third amplifier unit 54C, and a fourth amplifier unit 54D. Although the depicted embodiment includes four amplifier units 54, the depicted embodiment is not intended to be limiting and other embodiments may include two or more amplifier units 54.

As depicted, the envelope voltage amplifier 52 includes an operational amplifier 58 that receives the envelope voltage signal (e.g., $V_{env}$) from the transceiver 38, a power supply rail 60, a transistor 62, and a capacitor 64. In the depicted embodiment, the envelope voltage amplifier 52 is connected in a negative feedback loop. More specifically, the operational amplifier 58 may receive the envelope voltage signal at its inverting terminal and the output voltage of the envelope voltage amplifier 52 (e.g., voltage at output 66) at the non-inverting terminal. Accordingly, the operational amplifier 58 may amplify the difference between the output voltage, which is filtered by the capacitor 64, and the envelope voltage.

Additionally, in the depicted embodiment, the transistor 62 has a gate connected to the output of the operational amplifier 58, a source connected to the power supply rail 60, and a drain connected to the output 66 of the envelope voltage amplifier 52. More specifically, a power source, such as power source 22, may supply DC electrical power to the power supply rail 60 such that the supply rail 60 has a static voltage. As such, the transistor 62 may selectively connect the output 66 to the power supply rail 60 based on difference between the output voltage and the envelope voltage. In this manner, the envelope voltage amplifier 52 may output electrical power at approximately the envelope voltage to a variable voltage supply rail 67 based on the envelope voltage signal.

As depicted, each amplifier unit 54 includes a logic gate (e.g., AND gate) 68, a driver (e.g., buffer) 70, and a switching power amplifier 72. More specifically, the logic gate 68 receives the input analog electrical signal (e.g., $V_{in}$) and one bit of the amplifier control signal (e.g., Ctrl). For example, the first logic gate 68A may receive a first bit of the amplifier control signal (e.g., Ctrl 1), the second logic gate 68B may receive a second bit of the amplifier control signal (e.g., Ctrl 2), the third logic gate 68C may receive a third bit of the amplifier control signal (e.g., Ctrl 3), and the fourth logic gate 68D may receive a fourth bit of the amplifier control signal (e.g., Ctrl 4).

In this manner, the amplifier control signal may enable or disable each of the amplifier units 54. More specifically, when the logic gate 68 receives a "0" bit, the output is maintained at zero volts, thereby disabling the amplifier unit 54. On the other hand, when the logic gate 68 receives a "1" bit, the logic gate 68 passes the input analog electrical signal (e.g., $V_{in}$) to the driver 70, thereby enabling the amplifier unit 54.

In each enabled amplifier unit 54, the driver 70 may receive the input analog electrical signal from the logic gate 68 and amplify magnitude to a driving voltage. More specifically, since the switching power amplifier 72 may include one or more transistors, the driver 70 may amplify the input analog signal to a voltage sufficient to drive the transistors. In other words, enabled drivers 70 may have the same power consumption regardless of desired output power, which may decrease efficiency at lower output powers. As such, by disabling amplifier units 54 and their associated drivers 70, power consumption by the amplifier component 40 may be decreased, thereby increasing efficiency as the lower output powers.

Enabled switching power amplifier 72 may then generate an output analog electrical signal by selectively connecting an output to the variable voltage supply rail 67 or ground 74 based on the input analog electrical signal. For example, when the input analog electrical signal is high (e.g., a positive voltage), the switching power amplifier 72 may connect the output to the variable voltage supply rail 67. On the other hand, when the input analog electrical signal is low (e.g., zero volts), the switching power amplifier 72 may connect the output to ground 74.

The output analog electrical signal from each of the enabled switching power amplifiers 72 may then be combined and smoothed by the matching components 56 to generate an amplified analog electrical signal (e.g., $V_{out}$). In the depicted embodiment, the matching components 56 include a plurality of capacitors 76 with one capacitor 76 coupled in series with each amplifier unit 54 and an inductor 78 coupled in series with the plurality of the capacitors 76.

In other words, the magnitude (e.g., amplitude) of each enabled amplifier unit 54 may be based at least in part on the voltage on the variable voltage supply rail 67. Additionally, the magnitude (e.g., amplitude) of the amplified analog electrical signal may be based at least in part on the number of amplifier units 54 enabled. As such, the radio frequency system 12 may control output power of the amplified analog electrical signal using the envelope voltage signal and the amplifier control signal.

Figure 7:
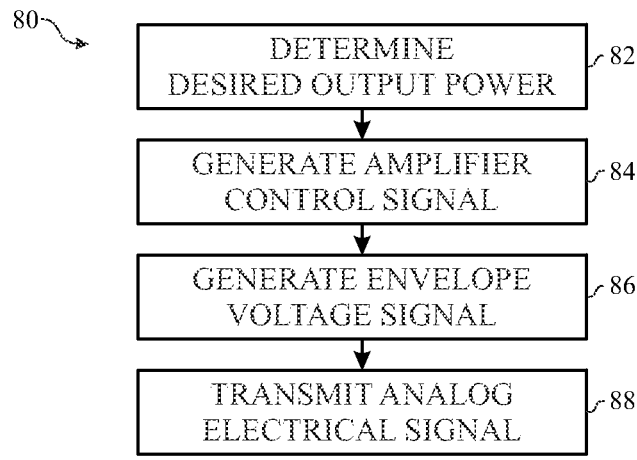
FIG. 7 is a flow diagram describing a process for controlling output power of the amplifier component of FIG. 6, in accordance with an embodiment.

To help illustrate, a process 80 for transmitting an analog electrical signal at a desired output power is described in FIG. 7. Generally, the process 80 includes determining a desired output power (process block 82), generating an amplifier control signal (process block 84), generating an envelope voltage signal (process block 86), and transmitting an analog electrical signal (process block 88). In some embodiments, the process 80 may be implemented using instructions stored in the memory 50 and/or another suitable tangible non-transitory computer-readable medium and executable by the processor 48 and/or another suitable processing circuitry.

Accordingly, the radio frequency system 12 may determine the desired output power for transmitting the analog electrical signal (process block 82). In some embodiments, the desired output power may be based at least in part on the electronic device or network communicated with. For example, in a cellular setting, the network may instruct the radio frequency system 12 to increase output power or decrease output power. Additionally, in a personal area network setting, the radio frequency system 12 may attempt to gradually reduce output power until reliability is compromised. In some embodiments, the desired output power may be stored in the memory 50. Accordingly, to determine the desired output power, the radio frequency system 12 may poll the memory 50.

Based on the desired output power, the radio frequency system 12 may generate the envelope voltage signal (process block 86) and the amplifier control signal (process block 84). As described above, the amplifier control signal may instruct each amplifier unit 54 to enable or disable. Additionally, the envelope voltage signal may instruct each enabled amplifier unit 54 to generate an output analog electrical signal at the envelope voltage. In fact, the envelope voltage signal may be adjusted such that the enabled amplifier units 54 may generate amplified analog electrical signals over a range of output powers.

However, as discussed above, the power consumption by the amplifier component 40 may be reduced by reducing the number of enabled amplifier units 54. As such, the amplifier control signal may first be determined to enable a minimum number of amplifier units 54 capable of achieving the desired output power.

Figure 8:
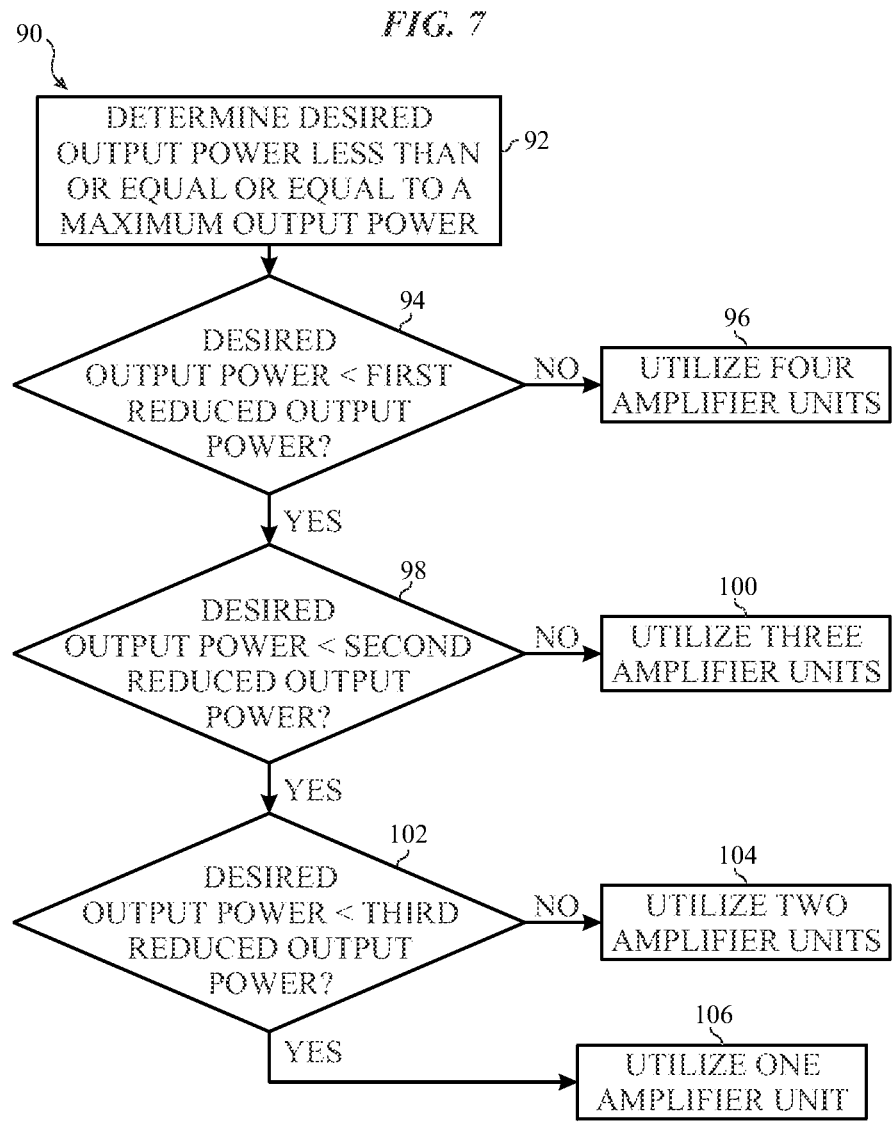
FIG. 8 is a flow diagram describing a process for adjusting number of amplifier units enabled or disabled in the amplifier component of FIG. 6, in accordance with an embodiment.

To help illustrate, an example of a process 90 for determining the number of amplifier units 54 to enable is described in FIG. 8. Generally, the process 90 includes determining that the desired output power is less than or equal to a maximum output power ($P_{max}$) (process block 92), determining whether the desired output power is less than a first reduced output power (decision block 94), utilizing four amplifier units when the desired output power is not less than the first reduced output power (process block 96), determining whether the desired output power is less than a second reduced output power when the desired output power is less than the first reduced output power (decision block 98), utilizing three amplifier units when the desired output power not less than the second reduced output power (process block 100), determining whether the desired output power is less than a third reduced output power when the output power is less than the second reduced output power (decision block 102), utilizing two amplifier units when the output power is not less than the third reduced output power (process block 104), and utilizing one amplifier unit when the output is less than the third reduced output power (process block 106). In some embodiments, the process 90 may be implemented using instructions stored in the memory 50 and/or another suitable tangible non-transitory computer-readable medium and executable by the processor 48 and/or another suitable processing circuitry.

Accordingly, when the desired output power is between the first reduced output power (e.g., $P_{max}$–2.5 dBm) and the maximum output power ($P_{max}$), the radio frequency system 12 may generate the amplifier control signal to enable all four amplifier units (e.g., 54A-54D) (process block 96). The radio frequency system 12 may then generate the envelope voltage signal to instruct the amplifier component 40 to generate the output power within a first output power range (e.g., between the first reduced output power and the maximum output power). More specifically, the envelope voltage signal may instruct each of the enabled amplifier units 54 to output an analog electrical signal at one quarter of the desired output power. In this manner, when the output analog electrical signals are combined by the matching components 56, the amplified analog electrical signal may have the desired output power.

Additionally, when the desired output power is between the second reduced output power (e.g., $P_{max}$–6 dBm) and the first reduced output power (e.g., $P_{max}$–2.5 dBm), the radio frequency system 12 may generate the amplifier control signal to enable three of the four amplifier units (e.g., 54A-54C) (process block 100). The radio frequency system 12 may then generate the envelope voltage signal to instruct the amplifier component 40 to generate the output power within a second output power range (e.g., between the second reduced output power and the first reduced output power). More specifically, the envelope voltage signal may instruct each of the enabled amplifier units 54 to output an analog electrical signal at one third of the desired output power. In this manner, when the output analog electrical signals are combined by the matching components 56, the amplified analog electrical signal may have the desired output power.

Furthermore, when the desired output power is between the third reduced output power (e.g., $P_{max}$–12 dBm) and the second reduced output power (e.g., $P_{max}$–6 dBm), the radio frequency system 12 may generate the amplifier control signal to enable two of the four amplifier units (e.g., 54A-54B) (process block 104). The radio frequency system 12 may then generate the envelope voltage signal to instruct the amplifier component 40 to generate the output power within a third output power range (e.g., between the third reduced output power and the second reduced output power). More specifically, the envelope voltage signal may instruct each of the enabled amplifier units 54 to output an analog electrical signal at one half of the desired output power. In this manner, when the output analog electrical signals are combined by the matching components 56, the amplified analog electrical signal may have the desired output power.

Finally, when the desired output power is less than the third reduced output power (e.g., $P_{max}$–12 dBm), the radio frequency system 12 may generate the amplifier control signal to enable one of the four amplifier units (e.g., 54A) (process block 106). The radio frequency system 12 may then generate the envelope voltage signal to instruct the amplifier component 40 to generate within a fourth output power range (e.g., output powers less than the third reduced output power). More specifically, the envelope voltage signal may instruct the enabled amplifier units 54 to output an analog electrical signal at the desired output power.

Figure 9:
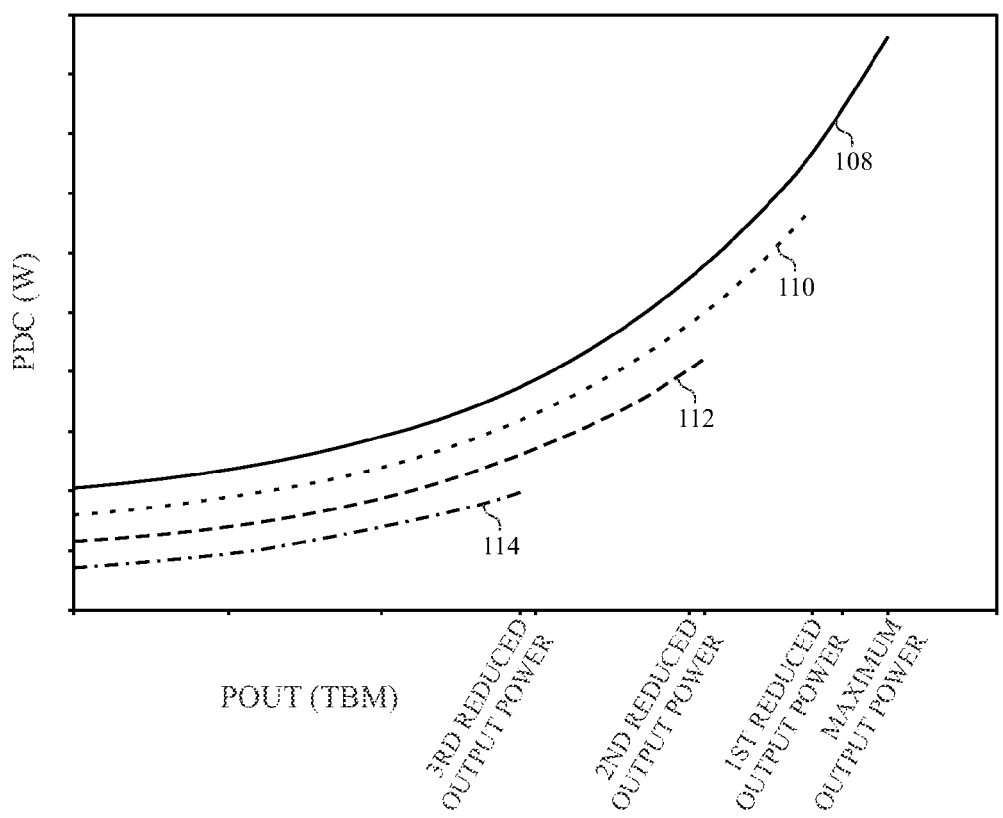
FIG. 9 is a plot of power consumption in relation to output power of the amplifier component of FIG. 6, in accordance with an embodiment.

Returning to FIG. 7, the amplified analog electrical signal may then be transmitted at the desired output power (process block 88). In fact, as discussed above, the amplifier component 40 may enable reduced power consumption as the desired output power decreases by decreasing number of amplifier units 54 enabled. To help illustrate, a plot of the power consumption of the amplifier component 40 with different numbers of amplifier units 54 enabled is described in FIG. 9. More specifically, FIG. 9 describes a first power consumption curve 108, which describes DC power consumption when four amplifier units 54 are enabled, a second power consumption curve 110, which describes DC power consumption when three amplifier units 54 are enabled, a third power consumption curve 112, which describes DC power consumption when two amplifier units 54 are enabled, and a fourth power consumption curve 114, which describes DC power consumption when one amplifier component is enabled.

As depicted, the amplifier component 40 may achieve output powers up to a maximum output power when four amplifier units 54 are enabled, output powers up to a first reduced output power when three amplifier units 54 are enabled, output powers up to a second reduced output power when two amplifier units 54 are enabled, and output powers up to a third reduced output power when one amplifier unit 54 is enabled. In other words, each configuration of enabled amplifier units 54 may be capable of producing a range of output powers. More specifically, as described above, the voltage on the variable voltage supply rail 67 maybe adjusted by an envelope voltage signal to enable the range of output powers.

However, as described by the first power consumption curve 108 and the second power consumption, the power consumption by the amplifier component 40 may be reduced by reducing the number of enabled amplifier units 54 to three when the desired output power is less than the first reduced output power (e.g., $P_{max}$–2.5 dBm). Additionally, as described by the second power consumption curve 110 and the third power consumption curve 112, the power consumption by the amplifier component 40 may again be reduced by reducing the number of enabled amplifier units 54 to two when the desired output power is less than the second reduced output power (e.g., $P_{max}$–6 dBm). Furthermore, as described by the third power consumption curve 112 and the fourth power consumption curve 114, the power consumption by the amplifier component 40 may again be reduced by reducing the number of enabled amplifier units 54 to one when the desired output power is less than the third reduced output power (e.g., $P_{max}$–12 dBm).

Figure 10:
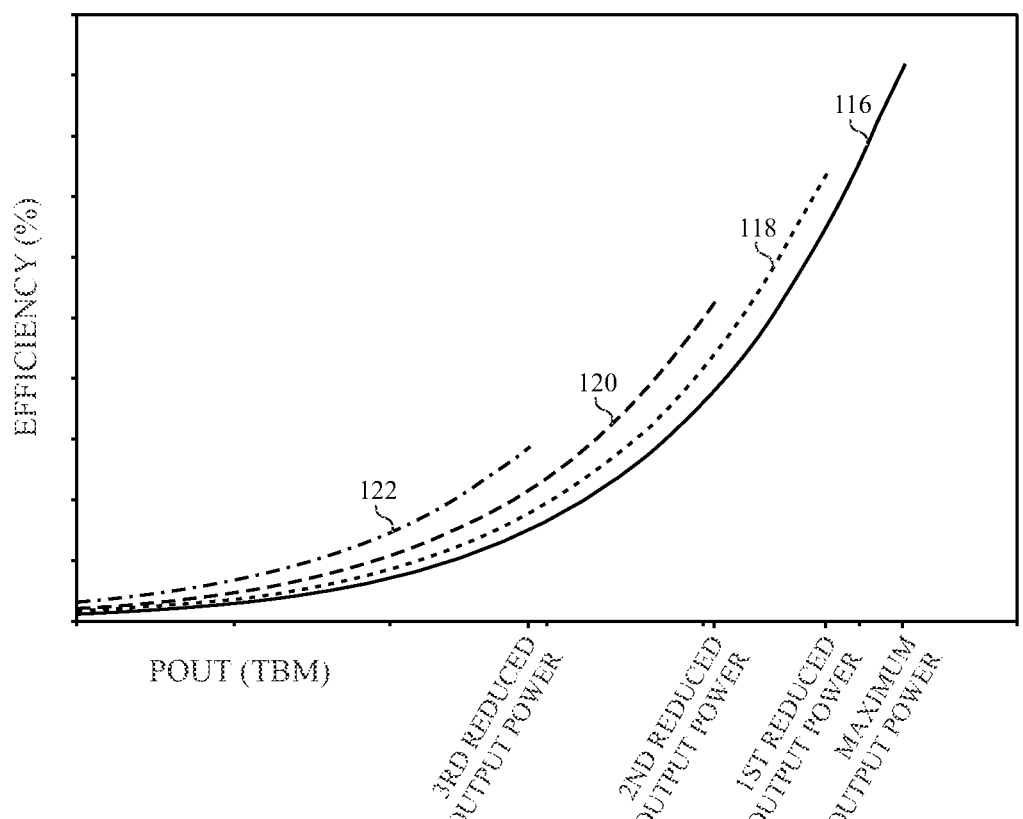
FIG. 10 is a plot of efficiency in relation to output power of the amplifier component of FIG. 6, in accordance with an embodiment.

Moreover, since the power consumption of the amplifier component 40 may be reduced, the efficiency (e.g., output power/DC power consumption) of the radio frequency system 12 may be increased. To help illustrate, FIG. 10 depicts a first efficiency curve 116, which describes efficiency when four amplifier units 54 are enabled, a second efficiency curve 118, which describes efficiency when three amplifier units 54 are enabled, a third efficiency curve 120, which describes efficiency when two amplifier units 54 are enabled, and a fourth efficiency curve 122, which describes DC efficiency when one amplifier component 40 is enabled.

As described by the fourth efficiency curve 122, the efficiency of the radio frequency system 12 is highest when utilizing one amplifier component 40 to generate output powers less than the third reduced output power (e.g., $P_{max}$–12 dBm). Additionally, as described by the third efficiency curve 120, the efficiency of the radio frequency system 12 is highest when utilizing two amplifier components 54 to generate output powers between the third reduced output power (e.g., $P_{max}$–12 dBm) and the second reduced output power (e.g., $P_{max}$–6 dBm). Furthermore, as described by the second efficiency curve 118, the efficiency of the radio frequency system 12 is highest when utilizing three amplifier components 54 to generate output powers between the second reduced output power (e.g., $P_{max}$–6 dBm) and the first reduced output power (e.g., $P_{max}$–2.5 dBm). And finally, as described by the first efficiency curve 116, the efficiency of the radio frequency system 12 is highest when utilizing four amplifier components 54 to generate output powers between the first reduced output power (e.g., $P_{max}$−2.5 dBm) and the maximum output power ($P_{max}$).

Thus, reducing the number of enabled amplifier units 54 may enable reduced power consumption and improved efficiency due to fewer unit cells in the switching PA and also fewer drivers 70 being enabled. More specifically, as described above, an enabled driver 70 continues to amplify the input analog electrical signal to the driving voltage regardless of the desired output power. As such, enabling the least number of amplifier units 54 to achieve a desired output power may facilitate reducing power consumption and improving efficiency.

Based on the number of enabled amplifier units 54, the radio frequency system 12 may then generate the envelope voltage signal to instruct the enabled amplifier units 54 to produce the amplified analog electrical signal at the desired output power. In fact, since each configuration of enabled amplifier units 54 may produce a range of output powers, frequency of enabling/disabling the amplifier units 54 may be reduced, thereby decreasing the likelihood of introducing additional noise or spurs. Moreover, since desired output power is generally adjusted between transmissions, the likelihood of introducing additional noise and spurs due to enabling/disabling the amplifier units 54 is further reduced.

In other words, the techniques described herein provide an amplifier component 40 that enables reduced power consumption and improved efficiency without significantly increasing the likelihood introducing spurious emissions when transmitting an analog electrical signal. More specifically, as described above, this may be achieved by an amplifier component 40 that include two or more amplifier units 54 that may be enabled/disabled based at least in part on a desired output power.

Figure 11:
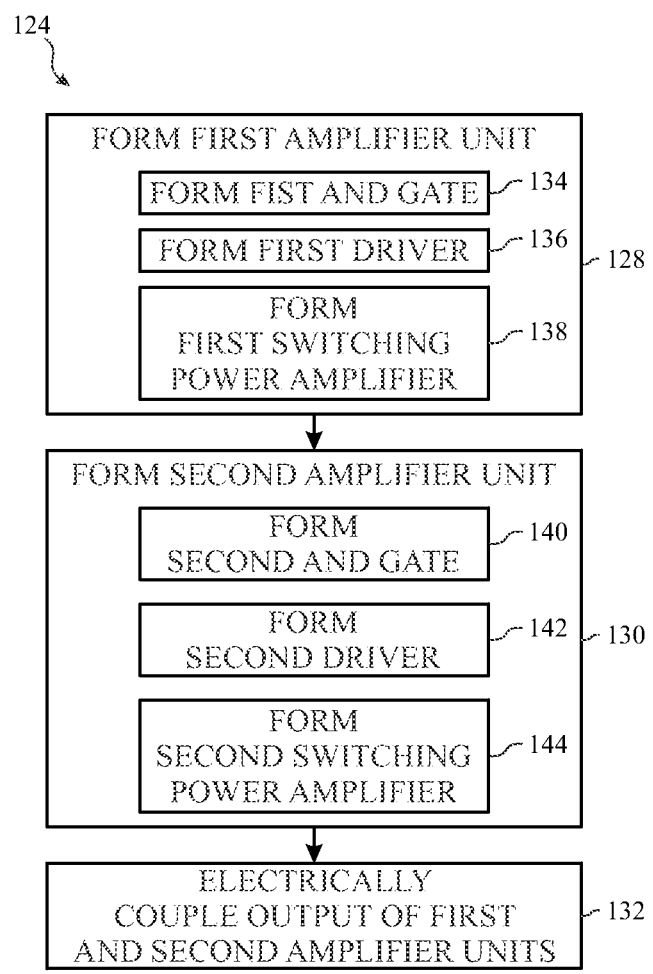
FIG. 11 is a flow diagram describing a process for assembling the amplifier component of FIG. 6, in accordance with an embodiment.

One embodiment of a process 124 for manufacturing such an amplifier component 40 is described in FIG. 11. Generally, the process 124 includes forming a first amplifier unit (process block 126), forming a second amplifier unit (process block 128), and electrically coupling the output of the first amplifier unit and the second amplifier unit (process block 130). In some embodiments, the process 124 may be performed by a manufacturer using instructions stored in a suitable tangible non-transitory computer-readable medium and executable by a suitable processing circuitry.

Accordingly, the manufacturer may form the first amplifier unit 54 (e.g., 54A) (process block 128). More specifically, forming the first amplifier unit 54 includes forming a first logic gate (process block 134), forming a first driver (process block 136), and forming a first switching power amplifier (process block 138). In some embodiments, the first logic gate 68 (e.g., 68A) may be formed such that it can receive an input analog electrical signal (e.g. $V_{in}$) from the transceiver 38 and a bit of the amplifier control signal (e.g., Ctrtl1) from the controller 46. In this manner, the first logic gate 68 may disable the first amplifier unit 54 when the amplifier control signal bit is "0" by outputting a zero volt analog electrical signal.

Additionally, the first driver 70 (e.g., 70A) may be formed such that it is electrically coupled to the output of the first logic gate 68. In this manner, when the first amplifier unit 54 is enabled, the first driver 70 may amplify the input analog electrical signal to a driving voltage. Furthermore, the first switching power amplifier 72 (e.g., 72A) may be formed such that it is electrically coupled to the output of the first driver 70 and can be electrically coupled to the variable voltage supply rail 67 and ground 74. In this manner, the first switching power amplifier 72 may selectively connect its output to either the variable voltage supply rail 67 or ground 74 to output an analog electrical signal at the envelope voltage.

Similarly, the manufacturer may form the second amplifier unit 54 (e.g., 54B) (process block 130). More specifically, forming the second amplifier unit 54 includes forming a second logic gate (process block 140), forming a second driver (process block 142), and forming a second switching power amplifier (process block 144). In some embodiments, the second logic gate 68 (e.g., 68B) may be formed such that it can receive the input analog electrical signal (e.g. $V_{in}$) from the transceiver 38 and a bit of the amplifier control signal (e.g., Ctrtl2) from the controller 46. In this manner, the second logic gate 68 may disable the second amplifier unit 54 when the amplifier control signal bit is "0" by outputting a zero volt analog electrical signal.

Additionally, the second driver 70 (e.g., 70B) may be formed such that it is electrically coupled to the output of the second logic gate 68. In this manner, when the second amplifier unit 54 is enabled, the second driver 70 may amplify the input analog electrical signal to a driving voltage. Furthermore, the second switching power amplifier 72 (e.g., 72B) may be formed such that it is electrically coupled to the output of the second driver 70 and can be electrically coupled to the variable voltage supply rail 67 and ground 74. In this manner, the second switching power amplifier 72 may selectively connect its output to either the variable voltage supply rail 67 or ground 74 to output an analog electrical signal at the envelope voltage.

The manufacturer may then electrically couple the output of the first amplifier unit 54 and the second amplifier unit 54 (process block 132). In some embodiments, the outputs may be electrically coupled via matching components 56, such as a plurality of capacitors 76 and an inductor 78. In this manner, the output analog electrical signal from the first amplifier unit 54 and the second amplifier unit 54 may be combined to generate the amplified analog electrical signal at the desired output power.

Although the process 124 is described in relation to two amplifier units 54, it should be appreciated by those of ordinary skill in the art that a similar process may be used to manufacture an amplifier component 40 with more than two amplifier units 54. Moreover, the number of amplifier units 54 used may be determined based on various factors, such as size constraints, design complexity, importance of power reduction, tolerance for spurious emissions, and the like. For example, an increased number of amplifier units 54 may be utilized to further reduce power consumption. However, the increased number of amplifier units 54 may also increase frequency of enabling/disabling, increase size, and increase design complexity.

Accordingly, the technical effects of the present disclosure include providing an improved amplifier component for a radio frequency system. More specifically, particularly at low output powers, the amplifier component may reduce power consumption and increase efficiency without significantly increasing spurious emissions. In some embodiments, the amplifier component may include two or more amplifier units that may be enabled or disabled based on a desired output power. As such, the number of enabled amplifier units may be decreased as the desired output power decreases, thereby decreasing power consumption and increasing efficiency. Moreover, since the amplifier units are generally enabled/disabled infrequently and between transmissions, the likelihood of spurious emissions is not significantly increased.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A radio frequency system configured to wirelessly transmit an amplified analog electrical signal, wherein the radio frequency system comprises:
   a first amplifier unit comprising:
      a first logic gate configured to receive a phase signal that indicates phase information of an input analog electrical signal and a first bit of an amplifier control signal, wherein the input analog electrical signal is an analog representation of data to be wirelessly transmitted and the first bit enables or disables the first amplifier unit; and
      a first switching power amplifier configured to generate a first output signal based at least in part on the phase signal when the first amplifier unit is enabled; and
   a second amplifier unit comprising:
      a second logic gate configured to receive the phase signal and a second bit of the amplifier control signal, wherein the second bit enables or disables the second amplifier unit; and
      a second switching power amplifier configured to generate a second output signal based at least in part on the phase signal when the second amplifier unit is enabled;
   wherein the first amplifier unit and the second amplifier unit are electrically coupled to enable the first output signal and the second output signal to be combined into the amplified analog electrical signal.

2. The radio frequency system of claim 1, comprising a third amplifier unit comprising:
      a third logic gate configured to receive the phase signal and a third bit of the amplifier control signal, wherein the third bit enables or disables the third amplifier unit; and
      a third switching power amplifier configured to generate a third output signal based at least in part on the phase signal when the third amplifier unit is enabled; and
   a fourth amplifier unit comprising:
      a fourth logic gate configured to receive the phase signal and a fourth bit of the amplifier control signal, wherein the fourth bit enables or disables the fourth amplifier unit; and
      a fourth switching power amplifier configured to generate a fourth output signal based at least in part on the phase signal when the fourth amplifier unit is enabled;
   wherein the first amplifier unit, the second amplifier unit, the third amplifier unit, and the fourth amplifier unit are electrically coupled to enable one or more of the first output signal, the second output signal, the third output signal, and the fourth output signal to be combined into the amplified analog electrical signal.

3. The radio frequency system of claim 1, wherein:
   the first amplifier unit comprises a first driver electrically coupled between the first logic gate and the first switching power amplifier, wherein the first driver is configured to amplify the phase signal to a first driving voltage of the first switching power amplifier when the phase signal is received from the first logic gate;
   the second amplifier unit comprises a second driver electrically coupled between the second logic gate and the second switching power amplifier, wherein the second driver is configured to amplify the phase signal to a second driving voltage of the second switching power amplifier when the phase signal is received from the second logic gate;
   the first logic gate comprises a first AND gate configured to:
      enable the first amplifier unit when the first bit of the amplifier control signal is high by supplying the phase signal to the first driver; and
      disable the first amplifier unit when the first bit of the amplifier control signal is low by blocking supply of the phase signal to the first driver; and
   the second logic gate comprises a second AND gate configured to:
      enable the second amplifier unit when the second bit of the amplifier control signal is high by supplying the phase signal to the second driver; and
      disable the first amplifier unit when the second bit of the amplifier control signal is low by blocking supply of the phase signal to the second driver.

4. The radio frequency system of claim 1, wherein:
   the first amplifier unit comprises a first driver electrically coupled between the first logic gate and the first switching power amplifier, wherein the first driver is configured to amplify the phase signal to a first driving voltage sufficient to switch the first switching power amplifier only when the first amplifier unit is enabled; and
   the second amplifier unit comprises a second driver electrically coupled between the second logic gate and the second switching power amplifier, wherein the second driver is configured to amplify the phase signal to a second driving voltage sufficient to switch the second switching power amplifier only when the second power amplifier unit is enabled.

5. The radio frequency system of claim 1, comprising:
   a first capacitor coupled in series with the first amplifier unit;
   a second capacitor coupled in series with the second amplifier unit; and
   an inductor coupled in series with the first capacitor and the second capacitor such that the first capacitor and the second capacitor are coupled in parallel;
   wherein the first capacitor, the second capacitor, and the inductor are configured to generate the amplified analog electrical signal by smoothing the first output signal, smoothing the second output signal, combining the first output signal and the second output signal, or any combination thereof.

6. The radio frequency system of claim 1, comprising an envelope voltage amplifier configured to:
   receive an envelope voltage signal determined based at least in part on amplitude of the input analog electrical signal and a desired output power of the amplified analog electrical signal; and
   output electrical power based at least in part on the envelope voltage signal; and
   a variable voltage supply rail electrically coupled between the envelope voltage amplifier, the first switching power amplifier, and the second switching power amplifier to facilitate supplying the electrical power output from the envelope voltage amplifier to the first switching power amplifier, the second switching power amplifier, or both.

7. The radio frequency system of claim 6, wherein:
the first amplifier unit is configured to generate the first output signal at an envelope voltage by electrically connecting a first output of the first switching power amplifier to the variable voltage supply rail when the phase signal is a first state and electrically connecting the first output to ground when the phase signal is a second state; and
the second amplifier unit is configured to generate the second output signal by electrically connecting a second output of the second switching power amplifier to the variable voltage supply rail when the phase signal is high and electrically connecting the second output to ground when the phase signal is low.

8. The radio frequency system of claim 1, wherein the first logic gate is configured to enable the first amplifier unit when the first bit is "1" and to disable the first amplifier unit when the first bit is a "0".

9. A tangible, non-transitory, computer-readable medium that stores instructions executable by one or more processors of a radio frequency system, wherein the instructions comprise instructions to:
determine, using the one or more processors, an envelope voltage signal based at least in part on a desired output power of an amplified analog electrical signal to be wirelessly transmitted from the radio frequency system;
communicate, using the one or more processors, the envelope voltage signal to an envelope voltage amplifier to enable the envelope voltage amplifier to output an envelope voltage based at least in part on the envelope voltage signal to a voltage supply rail;
determine, using the one or more processors, an amplifier control signal based at least in part on the desired output power;
communicate, using the one or more processors, a first bit of the amplifier control signal to a first amplifier unit of a plurality of amplifier units each electrically coupled to the voltage supply rail, wherein:
the first bit disables the first amplifier unit by instructing the first amplifier unit to block supply of a phase signal to a first driver electrically coupled to a first switching power amplifier in the first amplifier unit; and
the first bit enables the first amplifier unit by instructing the first amplifier unit to supply the phase signal to the first driver to enable the first driver to amplify the phase signal to a first driving voltage used by the first switching power amplifier to selectively couple a first output to the voltage supply rail to facilitate generating the amplified analog electrical signal; and
instruct, using the one or more processors, the radio frequency system to transmit the amplified analog electrical signal.

10. The computer-readable medium of claim 9, comprising instructions to supply the phase signal to an AND gate in the first amplifier unit, wherein:
the phase signal indicates target phase of the amplified analog electrical signal; and
the instructions to communicate the first bit of the amplifier control signal to the first amplifier unit comprise instructions to supply the first bit to the AND gate of the first amplifier unit to enable the AND gate to:
enable the first amplifier unit by communicating the phase signal to the first driver; and
disable the first amplifier unit by not communicating the phase signal to the first driver to facilitate reducing power consumption of the radio frequency system.

11. The computer-readable medium of claim 9, wherein the instructions to determine the amplifier control signal comprise instructions to:
enable a first number of the plurality of amplifier units when the desired output power is a first value; and
enable a second number of the plurality of amplifier units when the desired output power is a second value, wherein the first number is greater than the second number and the first value of the desired output power is greater than the second value of the desired output power.

12. The computer-readable medium of claim 9, wherein the instructions to generate the amplifier control signal comprise instructions to:
set the first bit of the amplifier control signal to "0" to disable the first amplifier unit; and
set the first bit to "1" to enable the first amplifier unit.

13. The computer-readable medium of claim 9, comprising instructions to communicate, using the one or more processors, a second bit of the amplifier control signal to a second amplifier unit of the plurality of amplifier units, wherein:
the second bit disables the second amplifier unit by instructing the second amplifier unit to block supply of the phase signal to a second driver electrically coupled to a second switching power amplifier in the second amplifier unit; and
the second bit enables the second amplifier unit by instructing the second amplifier unit to supply the phase signal to the second driver to enable the second driver to amplify the phase signal to a second driving voltage used by the second switching power amplifier to selectively couple a second output to the voltage supply rail to facilitate generating the amplified analog electrical signal.

14. A method for manufacturing an amplifier component used in a radio frequency system, comprising:
forming a first amplifier unit comprising:
forming a first logic gate configured to receive a phase signal that indicates phase information of an input analog electrical signal and a first bit of an amplifier control signal that enables or disables the first amplifier unit;
forming a first driver electrically coupled to an output of the first logic gate such that first driver is configured to receive the phase signal when the first amplifier unit is enabled; and
forming a first switching power amplifier electrically coupled to an output of the first driver and configured to be electrically coupled to a variable voltage supply rail and ground; and
forming a second amplifier unit comprising:
forming a second logic gate configured to receive the phase signal and a second bit of the amplifier control signal that enables or disables the second amplifier unit;
forming a second driver electrically coupled to an output of the second logic gate such that the second driver is configured to receive the phase signal when the second amplifier unit is enabled; and forming a second switching power amplifier electrically coupled to an output of the second driver and configured to be electrically coupled to the variable voltage supply rail and ground; and electrically coupling an output of the first amplifier unit and an output of the second amplifier unit to enable generating an amplified analog electrical signal to be transmitted by the radio frequency system.

15. The method of claim 14, comprising:
forming a third amplifier unit comprising:
  forming a third logic gate configured to receive the phase signal and a third bit of the amplifier control signal that enables or disables the third amplifier unit;
  forming a third driver electrically coupled to an output of the third logic gate such that the third driver is configured to receive the phase signal when the third amplifier unit is enabled; and
  forming a third switching power amplifier electrically coupled to an output of the third driver and configured to be electrically coupled to the variable voltage supply rail and ground; and
forming a fourth amplifier unit comprising:
  forming a fourth logic gate configured to receive the phase signal and a fourth bit of the amplifier control signal that enables or disables the fourth amplifier unit;
  forming a fourth driver electrically coupled to an output of the fourth logic gate such that the fourth driver is configured to receive the phase signal when the fourth amplifier unit is enabled; and
  forming a fourth switching power amplifier electrically coupled to an output of the fourth driver and configured to be electrically coupled to the variable voltage supply rail and ground; and
electrically coupling an output of the third amplifier unit and an output of the fourth amplifier unit with the output of the first amplifier unit and the output of the second amplifier unit.

16. The method of claim 14, wherein forming the first switching power amplifier comprises forming the first switching power amplifier to, when the first amplifier unit is enabled:
electrically connect the output of the first amplifier unit to the variable voltage supply rail when the phase signal is high; and
electrically connect the output of the first amplifier unit to ground when the phase signal is low.

17. The method of claim 14, wherein electrically coupling the output of the first amplifier unit and the output of the second amplifier unit comprises:
coupling a first capacitor in series with the output of the first amplifier unit;
coupling a second capacitor in series with the output of the second amplifier unit; and
coupling an inductor in series with the first capacitor and the second capacitor such that the first capacitor and the second capacitor are coupled in parallel.

18. The method of claim 14, comprising forming an envelope voltage amplifier configured to be electrically coupled to the variable voltage supply rail, wherein forming the envelope voltage amplifier comprises:
forming an operational amplifier configured to receive an envelope voltage signal and a feedback of voltage output from the envelope voltage amplifier to the variable voltage supply rail; and forming a transistor such that a gate of the transistor is electrically coupled to an output of the operational amplifier, a source of the transistor is configured to be electrically coupled to a power supply rail, and a drain of the transistor is electrically coupled to the variable voltage supply rail.

19. The method of claim 14, wherein the first switching power amplifier and the second switching power amplifier are configured to be coupled in parallel between the variable voltage supply rail and ground.

20. The method of claim 14, wherein the first amplifier unit and the second amplifier unit are configured to be coupled in parallel between a transceiver that generates the input analog electrical signal and an output of the amplifier component.

21. The method of claim 14, wherein:
forming the first logic gate comprises forming a first AND gate that disables the first amplifier unit by blocking supply of the phase signal to the first driver and enables the first amplifier unit by supplying the phase signal to the first driver;
forming the first driver comprises forming the first driver to amplify the phase signal to a first driving voltage of the first switching power amplifier when the first driver receives the phase signal;
forming the second logic gate comprises forming a second AND gate that disables the second amplifier unit by blocking supply of the phase signal to the second driver and enables the second amplifier unit by supplying the phase signal to the second driver; and
forming the second driver comprises forming the second driver to amplify the phase signal to a second driving voltage of the second switching power amplifier when the second driver receives the phase signal.

22. An electronic device configured to wirelessly transmit data indicated by an amplified analog electrical signal, comprising:
a controller configured to:
  generate an envelope signal based at least in part on desired output power of the amplified analog electrical signal; and
  generate an input signal that indicates phase information of the amplified analog electrical signal; and
an amplifier component communicatively coupled to the controller, wherein the amplifier component comprises:
  an envelope voltage amplifier configured to supply electrical power to a variable voltage supply rail at an envelope voltage based at least in part on the envelope signal; and
  a plurality of amplifier units electrically coupled in parallel between the variable voltage supply rail and ground, wherein each of the plurality of amplifier units comprises:
    a driver configured to generate a driving signal by amplifying the input signal to a driving voltage only when a corresponding amplifier unit is enabled by an amplifier control signal; and
    a power amplifier communicatively coupled to the driver, wherein the power amplifier is configured to selectively couple an output to the variable voltage supply rail based at least in part on the driving signal to facilitate generating the amplified analog electrical signal.

23. The electronic device of claim 22, wherein the controller is configured to generate the amplifier control signal based at least in part on the desired output power, wherein:

the amplifier control signal comprises a plurality of bits; and each of the plurality of bits enables or disables one of the plurality of amplifier units.

24. The electronic device of claim 22, wherein the power amplifier in each of the plurality of amplifier units comprises a switch mode power amplifier.

25. The electronic device of claim 22, wherein each of the plurality of amplifier units comprises a logic gate communicatively coupled to the driver, wherein the logic gate is configured to:

receive the input signal and one bit of the amplifier control signal;

enable the corresponding amplifier unit by supplying the input signal to the driver when the one bit is high; and disable the corresponding power amplifier unit by blocking supply of the input signal to the driver when the one bit is low.

26. The electronic device of claim 22, wherein the electronic device comprises a portable phone, a media player, a personal data organizer, a handheld game platform, a tablet device, a computer, or any combination thereof.

* * * * *